United States Patent
Murata

(10) Patent No.: US 7,570,048 B2
(45) Date of Patent: Aug. 4, 2009

(54) MAGNETIC SENSOR HAVING SPIN VALVE TYPE ELECTRO-MAGNETIC TRANSFORMATION DEVICE

(75) Inventor: Yuichiro Murata, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/480,994

(22) Filed: Jul. 6, 2006

(65) Prior Publication Data
US 2007/0013367 A1 Jan. 18, 2007

(30) Foreign Application Priority Data
Jul. 13, 2005 (JP) ............... 2005-204808

(51) Int. Cl.
*G01R 33/09* (2006.01)
*G01B 7/30* (2006.01)
(52) U.S. Cl. .............. 324/207.21; 324/207.25
(58) Field of Classification Search ........... 324/207.21, 324/207.25, 252, 207.2, 249, 251, 219, 207.24, 324/207.26; 338/32 R, 32 H
See application file for complete search history.

(56) References Cited
U.S. PATENT DOCUMENTS

| | | | |
|---|---|---|---|
| 4,649,342 A | 3/1987 | Nakamura | |
| 6,329,818 B1 | 12/2001 | Tokunaga et al. | |
| 6,661,225 B2 | 12/2003 | Toyoda et al. | |
| 6,734,671 B2 | 5/2004 | Murata et al. | |
| 6,882,145 B2 * | 4/2005 | Ehresmann et al. | 324/252 |
| 7,061,232 B2 * | 6/2006 | Haas et al. | 324/207.21 |
| 2003/0173955 A1 * | 9/2003 | Uenoyama | 324/207.21 |
| 2003/0211638 A1 | 11/2003 | Murata et al. | |
| 2004/0130314 A1 * | 7/2004 | Bossoli et al. | 324/174 |
| 2004/0189285 A1 * | 9/2004 | Uenoyama | 324/207.12 |

FOREIGN PATENT DOCUMENTS

| | | |
|---|---|---|
| JP | A-60-003515 | 1/1985 |
| JP | A-2004-077374 | 3/2004 |

* cited by examiner

*Primary Examiner*—Patrick J Assouad
*Assistant Examiner*—David M. Schindler
(74) *Attorney, Agent, or Firm*—Posz Law Group, PLC

(57) ABSTRACT

A magnetic sensor for detecting an object includes: a detection portion including one half bridge, which has two spin valve type electro-magnetic transformation devices disposed on a substrate; and a magnet near the detection portion having a magnetic field changeable in accordance with influence of the object. The spin valve type electro-magnetic transformation devices are arranged with respect to the magnet in such a manner that a direction of a magnetic field to be applied to one of the spin valve type electro-magnetic transformation devices is opposite to a direction of a magnetic field to be applied to the other one of the spin valve type electro-magnetic transformation devices.

18 Claims, 5 Drawing Sheets

MAGNETIC SENSOR HAVING SPIN VALVE TYPE ELECTRO-MAGNETIC TRANSFORMATION DEVICE

CROSS REFERENCE TO RELATED APPLICATION

This application is based on Japanese Patent Application No. 2005-204808 filed on Jul. 13, 2005, the disclosure of which is incorporated herein by reference.

FIELD OF THE INVENTION

The present invention relates to a magnetic sensor having a spin vale type electro-magnetic transformation device.

BACKGROUND OF THE INVENTION

A spin vale type electro-magnetic transformation device includes two ferromagnetic layers, which are a pinned layer and a free layer. In the pinned layer, a magnetization direction is fixed with an anti-ferromagnetic layer. In the free layer, the magnetization direction is changed in accordance with magnetic field. A magnetic sensor having the spin vale type electro-magnetic transformation device is well known. The magnetic sensor includes two spin vale type electro-magnetic transformation devices on a substrate so that two devices provide a half bridge circuit. The half bridge circuit functions as a detection portion of the magnetic field. Thus, temperature dependency in each device is cancelled each other.

However, the anti-ferromagnetic layer and the pinned layer composing the device are integrally formed on the same substrate. Therefore, the magnetization direction in the pinned layer stays constant. The magnetization direction is fixed, i.e., pinned with the anti-ferromagnetic layer. Accordingly, when the magnetic field applied to each device is almost the same, output from the half bridge becomes small. Specifically, when the direction of the magnetic field and the magnitude of magnetic flux in the magnetic field applied to each device are the same between two devices, the bridge output is extremely small.

In view of the above problem, a magnetic sensor is disclosed in U.S. Pat. No. 6,734,671. In this sensor, one of spin valve electro-magnetic transformation devices is covered with a magnetic shield layer. Accordingly, even if the magnetic field applied to each device is almost the same, a bridge output from a half bridge is increased.

However, in the above sensor, since one of the spin valve electro-magnetic transformation devices is covered with the magnetic shield layer, a sensitivity of the one spin valve electro-magnetic transformation device is reduced. Thus, resistance change of each device is not sufficiently retrieved as the bridge output, i.e., the sensor has low sensitivity.

SUMMARY OF THE INVENTION

In view of the above-described problem, it is an object of the present disclosure to provide a magnetic sensor having a spin vale type electro-magnetic transformation device with high sensitivity.

According to an aspect of the present disclosure, a magnetic sensor for detecting an object includes: a detection portion including at least one half bridge, wherein the half bridge has two spin valve type electro-magnetic transformation devices disposed on a substrate; and a magnet disposed near the detection portion, wherein the magnet has a magnetic field changeable in accordance with influence of the object.

The spin valve type electro-magnetic transformation devices are arranged with respect to the magnet in such a manner that a direction of a magnetic field to be applied to one of the spin valve type electro-magnetic transformation devices is opposite to a direction of a magnetic field to be applied to the other one of the spin valve type electro-magnetic transformation devices.

In this case, when the resistance of the one of the pin valve type electro-magnetic transformation devices increases with respect to the applied magnetic field, the resistance of the other one of the pin valve type electro-magnetic transformation devices decreases. Thus, the bridge output of the sensor is sufficiently obtained without loss of resistance change. Thus, the sensor has high sensitivity. Further, since the sensor has no magnetic shield, the construction and the manufacturing method of the sensor are simplified.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

A magnetic sensor according to an embodiment of the present invention includes a spin vale type electro-magnetic transformation device as a detection portion. The device is, for example, a tunneling magneto resistance device.

Figure 1:
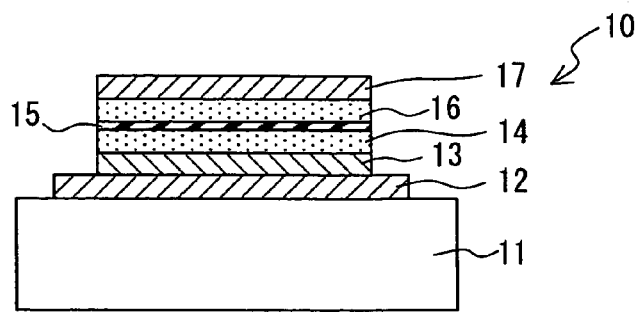
FIG. 1 is a cross sectional view showing a tunneling magneto resistance device.

The tunneling magneto resistance device (i.e., a TMR device) 10 is shown in FIG. 1. The TMR device 10 includes a substrate 11, a lower electrode 12, an anti-ferromagnetic layer 13, a pinned layer 14, a tunnel barrier layer 15, a free layer 16 and an upper electrode 17. The lower electrode 12, the anti-ferromagnetic layer 13, the pinned layer 14, the tunnel barrier layer 15, the free layer 16 and the upper electrode 17 are formed on the substrate 11 in this order. The substrate 11 is made of silicon, glass or the like. The substrate 11 includes an oxide film thereon. The pinned layer 14 is made of a ferromagnetic film, and the free layer 16 is also made of a ferromagnetic film.

The lower electrode 12 and the upper electrode 17 flow current therebetween so that the current flows in a stack direction of the substrate 11, which is perpendicular to the surface of the substrate 11. The lower and upper electrodes are made of electrode material such as Pt, Cr, Ti, W, Au and Mo. The anti-ferromagnetic layer 13 is used for fixation of a magnetization direction of the pinned layer 14. Here, the magnetization direction represents a direction of a magnetic spin. The anti-ferromagnetic layer 13 is made of ant-ferromagnetic material such as Fe—Mn, Pt—Mn and Rh—Mn. The magnetization direction in the pinned layer 14 is fixed, i.e., pinned with the anti-ferromagnetic layer 13. The pinned layer 14 is made of ferromagnetic material such as Ni—Fe. The tunnel barrier layer 15 has a thickness in a range between a few Angstroms and a few tens of Angstroms. The tunnel barrier layer 15 is made of insulation and non-magnetic material such as alumina. The magnetization direction in the free layer 16 freely flips in accordance with applied magnetic field. The free layer 16 is made of ferromagnetic material such as Ni—Fe. Each part of the TMR device 10 is formed by a deposition method such as a vapour deposition method and a sputtering method, and a photolithography method.

In this TMR device 10, when the magnetization direction of the pinned layer 14 coincides with, i.e., is in parallel to, the magnetization direction of the free layer 16, the resistance of the device 10 becomes minimum. When the magnetization direction of the pinned layer 14 is in anti-parallel to, i.e., opposite to, the magnetization direction of the free layer 16, the resistance of the device 10 becomes maximum. The magnetization direction of the free layer 16 is changed in response to the applied magnetic field. Therefore, a change of the magneto resistance is detected on the basis of a tunneling current flowing between two electrodes 12, 17 through the tunnel barrier layer 15.

The resistance change rate of the TMR device 10 is larger about a few tens percents than that of a conventional magneto-resistance device (i.e., MR device). Therefore, the sensitivity of the device 10 is improved. The required amplification factor of a signal outputted from the TMR device 10 is smaller than that of the conventional MR device. Accordingly, a compensation circuit for removing a noise on the signal may have small dimensions, and be simplified.

Figure 2A:
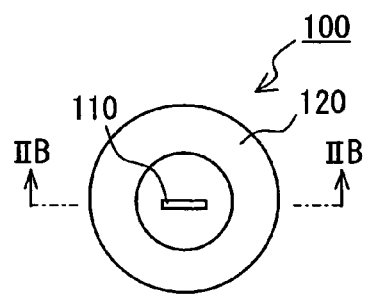
FIG. 2A is a top view showing a magnetic sensor according to an embodiment of the present invention.
Figure 2B:
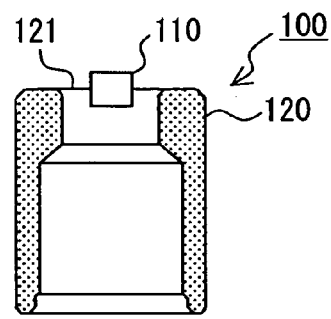
FIG. 2B is a cross sectional view showing the sensor taken along line IIB-IIB in FIG. 2A.
Figure 2C:
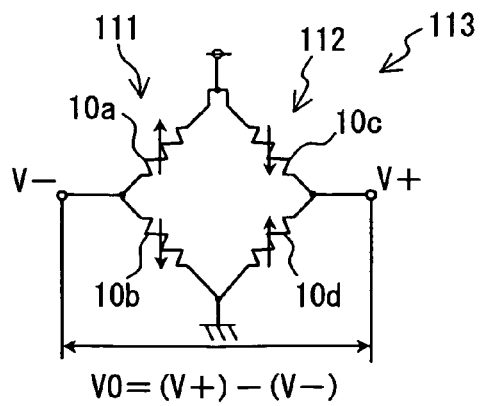
FIG. 2C is a circuit diagram showing a detection portion in the sensor.
Figure 3:
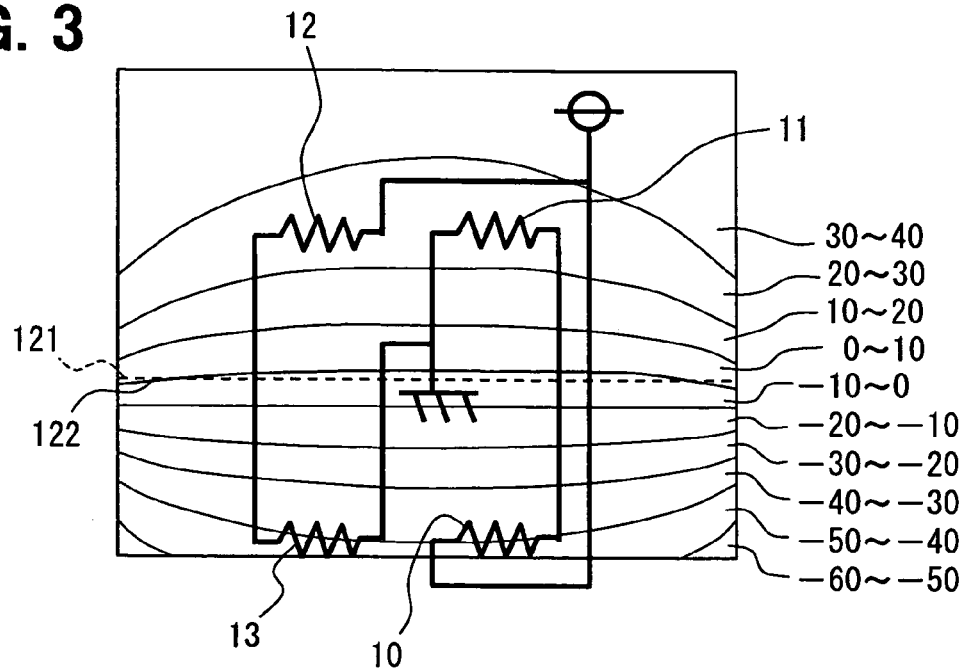
FIG. 3 is an intensity distribution of a magnetic field around an opening edge of a magnet in the sensor.

A magnetic sensor 100 according to an embodiment of the present invention is shown in FIGS. 2 and 3. FIG. 3 shows an intensity distribution of a magnetic field around an opening of a magnet 120 in the sensor 100. In FIG. 3, a lower part of the intensity distribution disposed below a dash line of FIG. 3 represents an inside of a hollow portion in the magnet 120.

The sensor 100 includes a sensor chip 110 and the magnet 120. The sensor chip 110 has a detection portion 113 including at least one half bridge, which is composed of two spin valve type electro-magnetic transformation devices. The magnet 120 is disposed near the sensor chip 110. A magnetic field of the magnet 120 is changeable in accordance with an object to be detected.

Since the detection portion 113 includes at least one half bridge composed of two spin valve type electro-magnetic transformation devices, temperature characteristics such as temperature dependence of each device are cancelled each other. Alternatively, the detection portion 113 may include multiple half bridges.

Each spin valve type electro-magnetic transformation device is formed of the TMR device 10. As shown in FIG. 2C, the detection portion 113 in the sensor chip 110 includes a full bridge circuit having two half bridges 111, 112, which are connected in parallel to each other. The half bridge 111 is composed of two TRM devices 10a, 10b, and the half bridge 112 is composed of two TMR devices 10c, 10d. Thus, the sensor 100 has much high sensitivity. Each TMR device 10a-10d composing the detection portion 113 is formed on the same substrate 11.

The magnet 120 may be made of any magnetic material as long as the magnet 120 generates the magnetic field. For example, the magnet 120 is made of ferrite, rare earth or Nb-series material. The magnet 120 has almost cylindrical shape, and has two openings on both sides of the magnet 120.

The inventor simulates an intensity distribution of the magnetic field around the magnet 120, so that the intensity distribution shown in FIG. 3 is obtained. In FIG. 3, the intensity distribution has a portion, at which the direction of the magnetic field generated from the magnet 120 is changed almost inversely. Specifically, the magnetic field is inversed between the inside of the hollow portion of the magnet 120 and the outside of the magnet 120, the inside and the outside of the magnet 120 sandwiching an opening edge 121 of the magnet 120 disposed on an object side. The object is to be detected by the sensor 100. The opening edge 121 of the magnet 120 is shown as a dash line in FIG. 3. A line 122 in FIG. 3 represents an inversion line, at which the intensity of the magnetic field is inversed between a plus intensity and a minus intensity. In FIG. 3, the unit of the intensity of the magnetic field is mT. Thus, it is found that the direction of magnetic field inside the cylindrical hollow portion is opposite to the direction of magnetic field outside the cylindrical hollow portion, the magnetic field being generated by the magnet 120. The inside of the cylindrical hollow portion is disposed opposite to the outside of the cylindrical hollow portion through the opening edge 121.

On the half bridge 111, the direction of the magnetic field applied to the TMR device 10a by the magnet 120 is opposite to the direction of the magnetic field applied to the TMR device 10b. Specifically, one of the TMR devices 10a, 10b has a plus intensity of the magnetic field, and the other one of the TMR devices 10a, 10b has a minus intensity of the magnetic field. The TMR device 10a in the half bridge 111 is disposed inside of the hollow portion of the magnet 120, and the TMR device 10b in the half bridge 111 is disposed outside of the hollow portion of the magnet 120. Similarly, the TMR device 10c in the half bridge 112 is disposed inside of the hollow portion of the magnet 120, and the TMR device 10d in the half bridge 112 is disposed outside of the hollow portion of the magnet 120, so that the direction of the magnetic field applied to the TMR device 10c by the magnet 120 is opposite to the direction of the magnetic field applied to the TMR device 10d.

Each TMR device 10a-10d is disposed apart from the opening edge 121 in a range between 0.7 mm and 1.5 mm. The TMR devices 10a, 10b composing the half bridge 111 are arranged to face each other and to sandwich the opening edge 121. The TMR devices 10c, 10d composing the half bridge 112 are arranged to face each other and to sandwich the opening edge 121. Thus, a wiring for connecting among the TMR devices 10a-10d is simplified.

Figure 4A:
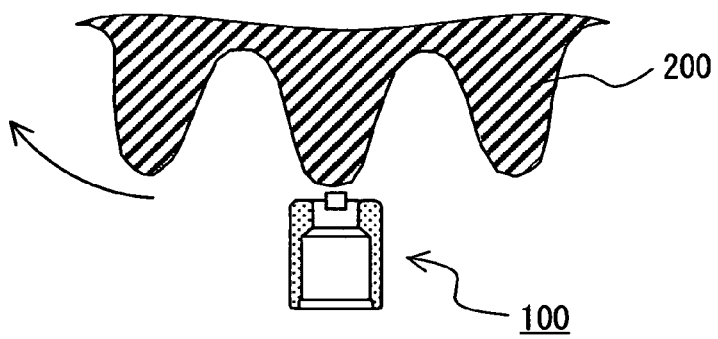
FIG. 4A is a schematic view explaining an arrangement between a rotor as an object and the sensor.
Figure 4B:
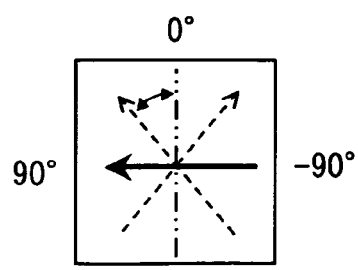
FIG. 4B is a view explaining a swing angle of the magnetic field.
Figure 5A:
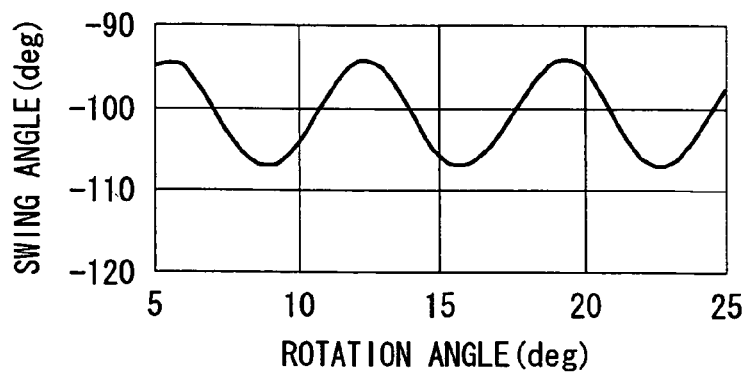
FIGS. 5A and 5B are graphs showing a relationship between a rotation angle of the rotor and the swing angle of the magnetic field applied to a TMR device.
Figure 5B:
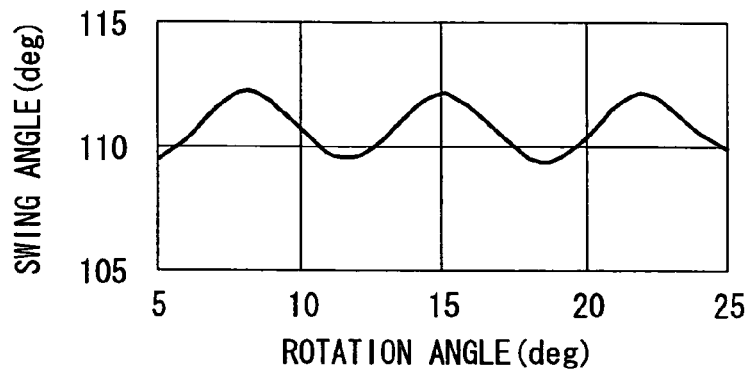
Figure 6:
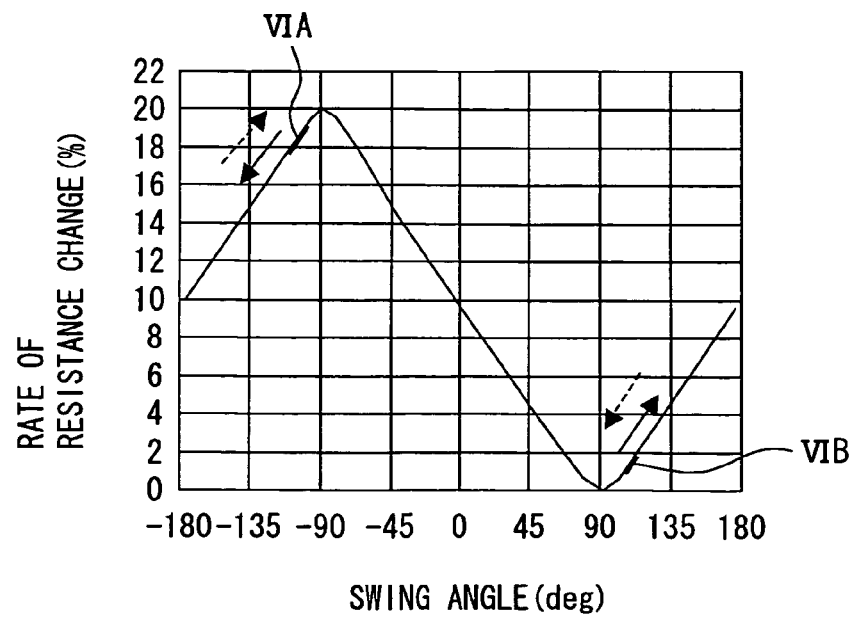
FIG. 6 is a graph showing a relationship between the swing angle of the magnetic field and a ratio of resistance change.

Next, effects and functions of the magnetic sensor 100 are explained. Specifically, effects and functions of one of the half bridges 111, 112, for example, the half bridge 111, are explained as follows. FIG. 4A shows a rotor 200 as an object to be detected and the magnetic sensor 100. The sensor 100 is arranged near the rotor 200. FIG. 4B explains a swing angle of the magnetic field. FIG. 5A shows a relationship between the swing angle of the magnetic field of the TMR device 10b and a rotation angle of the rotor 200. FIG. 5B shows a relationship between the swing angle of the magnetic field of the TMR device 10a and the rotation angle of the rotor 200. FIG. 6 shows a relationship between the swing angle of the applied magnetic field and a rate of a resistance change in the device 100.

Each swing angle of the TMR devices 10a, 10b is simulated when the magnetic sensor 100 is disposed near the rotor 200. For example, a distance, i.e., an air gap between the sensor chip 110 and the rotor 200 is 2 mm. Here, the swing angle of the magnetic field shows a direction of the magnetic field of each TMR device 10a, 10b. Specifically, the swing angle represents a direction of the applied magnetic field of the magnet 120, the magnetic field which is changed in accordance with the rotation of the rotor 200. For example, as shown in FIG. 4B, a solid line represents a magnetization direction in the pinned layer 14. A null degree line is defined to be perpendicular to the magnetization direction of the pinned layer 14. Specifically, the null degree is defined to be disposed on a rotor side on the null degree line, which is shown as a two-dot chain line in FIG. 4B. The swing angle between the applied magnetic field shown as a dashed line and the null degree line is defined as the swing angle of the magnetic field.

As shown in FIGS. 5A and 5B, even when the rotor 200 rotates, the applied magnetic field of the TMR device 10 is almost opposite to that of the TMR device 11. Thus, the applied magnetic field of the TMR device 10 has an almost opposite phase with respect to the applied magnetic field of the TMR device 11. The ratio of resistance change is measured on the basis of the swing angle of the magnetic field, i.e., the applied magnetic field angle, so that a relationship between the ratio of resistance change and the swing angle of the applied magnetic field shown in FIG. 6 is obtained. In FIG. 6, when the resistance of one of the TMR devices 10, 11 increases, the resistance of the other one of the TMR devices 10, 11 reduces. Here, VIA represents a range of the resistance change of the TMR device 11, and VIB represents a range of the resistance change of the TMR device 10.

In the magnetic sensor 100, since the resistance of one of the TMR devices 10, 11 increases with respect to the applied magnetic field when the resistance of the other one of the TMR devices 10, 11 reduces, a bridge output, i.e., a sensor output, is sufficiently obtained without loss of resistance change compared with a conventional magnetic field shield construction. Thus, the sensitivity of the sensor 100 is improved. Although the functions and effects of the half bridge 111 are explained above, the functions and the effects of the other half bridge 112 are the same as the bridge 111. Accordingly, the total sensitivity of the sensor 100 is much improved.

Although thermal stress problem is caused by a magnetic shield layer in the conventional magnetic field shield construction, it is not necessary for the sensor 100 to have a magnetic shield layer so that a crack caused by thermal stress is not generated in the sensor 100. Further, since it is not necessary for the sensor 100 to have a magnetic shield layer, the construction of the sensor 100 and a manufacturing method of the sensor 100 are simplified.

Although each TMR device 10a-10d is provided by one element, each TMR device 10a-10d may be provided by multiple elements, which are connected in series. Further, multiple elements composing each TMR device 10a-10d may be connected in parallel. Furthermore, each TMR device 10a-10d may be formed from multiple elements, which are connected in series and in parallel. Thus, each TMR device 10a-10d may be provided by a multiple-element group. In case of TMR device, the resistance of the TMR device is determined by the thickness. Therefore, it is preferred that each TMR device is provided by multiple TMR elements connected in series in order to obtain a predetermined resistance. The multiple TMR elements connected in series are described in JP-A-2002-333468.

(Modifications)

Although the TMR device 10a-10d is formed by the spin valve type electro-magnetic transformation device, the sensor 100 may be formed by another device as long as the another device includes the pinned layer 14 and the free layer 16 so that the resistance of the device is changed in accordance with the applied magnetic field. In the pinned layer 14, the magnetization direction in the pinned layer 14 is fixed by the anti-ferromagnetic layer 13, and the magnetization direction in the free layer 16 is changeable in accordance with the applied magnetic field. For example, the sensor 100 may be formed by a spin valve type giant magneto-resistance effect device (i.e., GMR device). In this case, the sensor 100 has a high sensitivity. Here, the sensitivity of the sensor 100 formed by the TMR device may be higher than that formed by the GMR device.

Although the sensor 100 is a rotation sensor for detecting rotation of the rotor 200, the sensor 100 may detect another object. For example, the sensor 100 may detect motion of a part, which moves linearly. The sensor 100 may detect motion of a part, which stays in one place such as the rotor 200.

Although the sensor 100 includes the full bridge composing two half bridges 111, 112, which are connected in parallel each other to provide the detection portion 113, the sensor 100 may include at least one half bridge.

Although the inversion line 122, at which the magnetic field intensity is changed between plus and minus, is determined by the dotted line shown in FIG. 3, the inversion line 122 may be determined by another line. Specifically, the inversion line 122 is changed in accordance with a shape of the magnet 120, a material of the magnet 120, and an air gap between the magnet 120 and an object to be detected. Accordingly, in the half bridge 111, 112, one of the TMR devices 10a-10d composing the half bridge 111, 112 is arranged on a predetermined position inside of the cylindrical hollow portion of the magnet 120, and the other one of the TMR devices 10a-10d composing the half bridge 111, 112 is arranged on a predetermined position outside of the cylindrical hollow portion of the magnet 120, so that the magnetic field direction applied to the one of the TMR devices 10a-10d is opposite to that to the other one of the TMR devices 10a-10d.

Figure 7A:
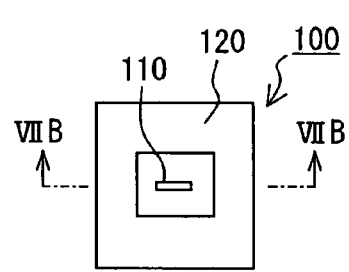
FIG. 7A is a top view showing a magnetic sensor according to a first modification of the embodiment of the present invention.
Figure 7B:
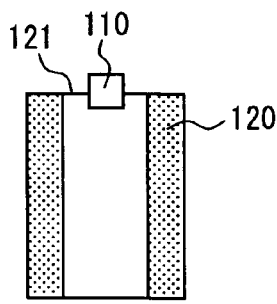
FIG. 7B is a cross sectional view showing the sensor taken along line VIIB-VIIB in FIG. 7A.
Figure 8A:
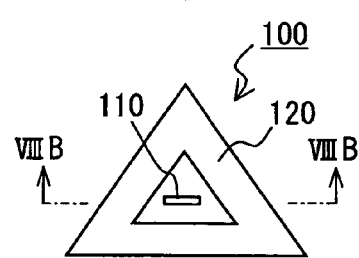
FIG. 8A is a top view showing a magnetic sensor according to a second modification of the embodiment of the present invention.
Figure 8B:
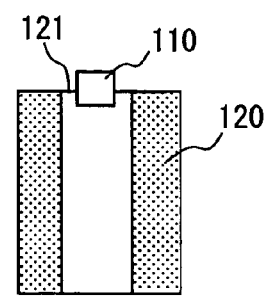
FIG. 8B is a cross sectional view showing the sensor taken along line VIIIB-VIIIB in FIG. 8A.

Although the magnet 120 has the cylindrical shape with the hollow portion, the magnet 120 may have another shape. For example, as shown in FIGS. 7A and 7B, the magnet 120 may have a hollow portion, a cross section of which is a rectangular shape. Further, as shown in FIGS. 8A and 8B, the magnet 120 may have a hollow portion, a cross section of which is a triangle shape. Furthermore, the magnet 120 may have a hollow portion, a cross section of which is a polygonal shape.

Figure 9A:
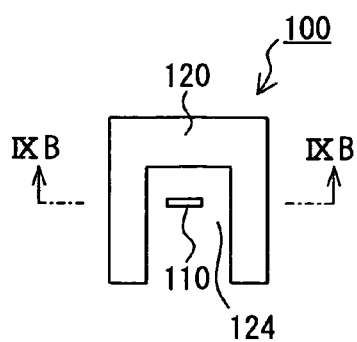
FIG. 9A is a top view showing a magnetic sensor according to a third modification of the embodiment of the present invention.
Figure 9B:
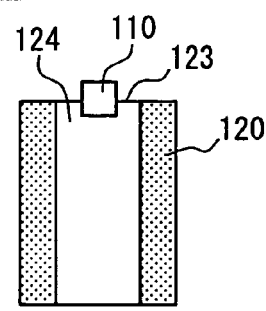
FIG. 9B is a cross sectional view showing the sensor taken along line IXB-IXB in FIG. 9A.

Although the magnet 120 has the cylindrical shape, the magnet 120 may have another shape. For example, as shown in FIGS. 9A and 9B, the magnet 120 may have a cross section of a U-shape. In FIGS. 9A and 9B, the magnet 120 includes a pair of facing portions, each of which is in parallel each other. A facing space 124 is provided by a pair of facing portions. In the facing space 124, one of the TMR devices 10*a*-10*d* composing the half bridge 111, 112 is arranged in the facing space 124, and the other one of the TMR devices 10*a*-10*d* is arranged outside of the magnet 120. Here, the magnet 120 has a top surface 123. The one of the TMR devices 10*a*-10*d* is disposed inside from the top surface 123 of the magnet 120, and the other one of the TMR devices 10*a*-10*d* is disposed outside from the top surface 123 of the magnet 120. In this case, the inventor finds that the direction of magnetic field inside the facing space 124 is opposite to the direction of magnetic field outside the facing space 124, the magnetic field being generated by the magnet 120. The inside of the facing space 124 is disposed opposite to the outside of the facing space 124 through the top surface 123.

Figure 10A:
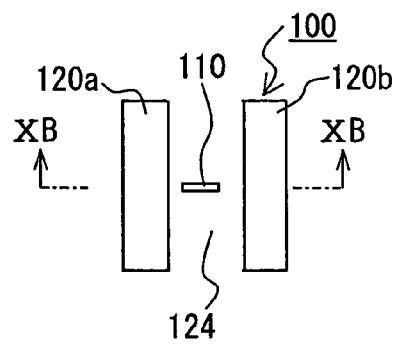
FIG. 10A is a top view showing a magnetic sensor according to a fourth modification of the embodiment of the present invention.
Figure 10B:
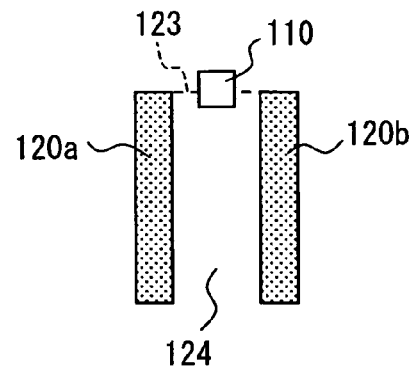
FIG. 10B is a cross sectional view showing the sensor taken along line XB-XB in FIG. 10A.
Figure 11A:
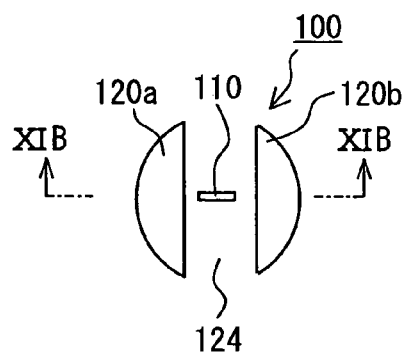
FIG. 11A is a top view showing a magnetic sensor according to a fifth modification of the embodiment of the present invention.
Figure 11B:
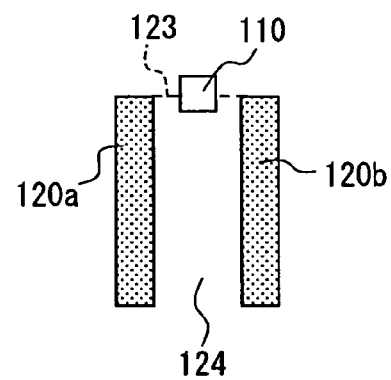
FIG. 11B is a cross sectional view showing the sensor taken along line XIB-XIB in FIG. 11A.

The magnet 120 may have a pair of facing portions 120*a*, 120*b*, which are not integrated, as shown in FIGS. 10A and 10B. Specifically, in this case, the facing space is provided by multiple parts 120*a*, 120*b*. Further, as shown in FIGS. 11A and 11B, the magnet 120 includes two facing portions 120*a*, 120*b*, which provide the facing space 124. In the facing space 1241, one of the TMR devices 10*a*-10*d* is disposed.

Figure 12A:
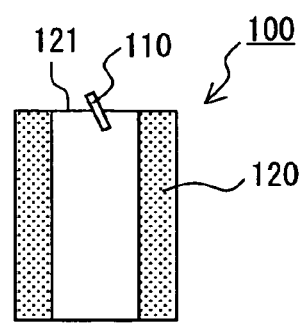
FIG. 12A is a cross sectional view showing a magnetic sensor according to a sixth modification of the embodiment of the present invention.
Figure 12B:
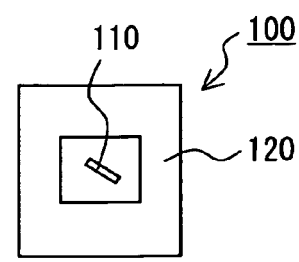
FIG. 12B is a top view showing a magnetic sensor according to a seventh modification of the embodiment of the present invention.

Although the surface of the sensor chip 110 is arranged to be in parallel to an extending direction of the magnet 120, the sensor chip 110 may be arranged another way as long as one of the TMRT devices 10*a*-10*d* has the opposite magnetic field direction to the other one of the TMR devices 10*a*-10*d*. For example, the sensor chip 110 may be arranged obliquely from the extending direction of the magnet 120, as shown in FIG. 12A. Further, the magnet 120 may be arranged obliquely from an inner wall of the magnet 120, as shown in FIG. 12B.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A magnetic sensor for detecting an object comprising:
    a detection portion including at least one half bridge, wherein the at least one half bridge has two spin valve type electro-magnetic transformation devices disposed on a substrate; and
    a magnet disposed near the detection portion, wherein the magnet has a magnetic field changeable in accordance with influence of the object,
    wherein the spin valve type electro-magnetic transformation devices are arranged with respect to the magnet in such a manner that a direction of a magnetic field to be applied to one of the spin valve type electro-magnetic transformation devices is opposite to a direction of a magnetic field to be applied to the other one of the spin valve type electro-magnetic transformation devices,
    wherein the magnet has an opening,
    wherein the opening of the magnet is disposed on an edge surface of the magnet so that the opening of the magnet faces the object,
    wherein all of the one of the spin valve type electro-magnetic transformation devices is disposed on an inside of the opening from the edge surface, and
    wherein all of the other one of the spin valve type electro-magnetic transformation devices is disposed on an outside of the opening from the edge surface.

2. The sensor according to claim 1, wherein the magnet has a cylindrical shape.

3. The sensor according to claim 2, wherein
    the one of the spin valve type electro-magnetic transformation devices faces the other one of the spin valve type electro-magnetic transformation devices through the edge surface of the cylindrical shape.

4. The sensor according to claim 1, wherein
    the magnet includes a first facing portion having a first face, and a second facing portion having a second face,
    the first face is parallel to the second face,
    a facing space is provided between the first and second facing portions,
    the first facing portion including a first edge surface facing the object,
    the second facing portion including a second edge surface facing the object,
    the one of the spin valve type electro-magnetic transformation devices is disposed on an inside of the facing space from the first and second edge portions, and the other one of the spin valve type electro-magnetic transformation devices is disposed on an outside of the facing space from the first and second edge portions.

5. The sensor according to claim 4, wherein
    each of the first and second facing portions is separately disposed so that the magnet includes multiple portions.

6. The sensor according to claim 1, wherein
    the detection portion further includes another half bridge so that two half bridges provide a full bridge.

7. The sensor according to claim 1, wherein
    at least one of the spin valve type electro-magnetic transformation devices is a tunneling magneto-resistance device.

8. The sensor according to claim 1, wherein
    at least one of the spin valve type electro-magnetic transformation devices is a giant magneto-resistance device.

9. The sensor according to claim 1, wherein
    each of the spin valve type electro-magnetic transformation devices includes multiple elements.

10. The sensor according to claim 1, wherein
    the object is a rotational body.

11. The sensor according to claim 1, wherein
    the magnet has a cylindrical outer shape and a cylindrical hollow portion with the opening,
    the opening of the cylindrical hollow portion faces the object,
    the detection portion is partially accommodated in the cylindrical hollow portion through the opening, and
    the one of the spin valve type electro-magnetic transformation devices is disposed on an inside of the cylindrical hollow portion, and the other one of the spin valve type electro-magnetic transformation devices is disposed on an outside of the cylindrical hollow portion.

12. The sensor according to claim 1, wherein
    the magnet has a square outer shape and a square hollow portion including the opening,
    the opening of the square hollow portion faces the object, the detection portion is partially accommodated in the square hollow portion through the opening, and the one of the spin valve type electro-magnetic transformation devices is disposed on an inside of the square hollow portion, and the other one of the spin valve type electro-magnetic transformation devices is disposed on an outside of the square hollow portion.

13. The sensor according to claim 1, wherein the magnet has a triangular outer shape and a triangular hollow portion with the opening, the opening of the triangular hollow portion faces the object, the detection portion is partially accommodated in the triangular hollow portion through the opening, and the one of the spin valve type electro-magnetic transformation devices is disposed on an inside of the triangular hollow portion, and the other one of the spin valve type electro-magnetic transformation devices is disposed on an outside of the triangular hollow portion.

14. The sensor according to claim 1, wherein the magnet has a U-shape with a pair of facing portions and a facing space with the opening, the facing portions provide the facing space, the opening of the facing space is disposed on one end of the magnet so that the opening faces the object, the detection portion is partially accommodated in the facing space through the opening, and the one of the spin valve type electro-magnetic transformation devices is disposed on an inside of the facing space, and the other one of the spin valve type electro-magnetic transformation devices is disposed on an outside of the facing space.

15. The sensor according to claim 1, wherein the magnet includes two plates, which face parallel to each other, the two plates provide a facing space forming the opening, the opening of the facing space is disposed on one end of the magnet so that the opening faces the object, the detection portion is partially accommodated in the facing space through the opening, and the one of the spin valve type electro-magnetic transformation devices is disposed on an inside of the facing space, and the other one of the spin valve type electro-magnetic transformation devices is disposed on an outside of the facing space.

16. The sensor according to claim 6, wherein the at least one half bridge includes first and second spin valve type electro-magnetic transformation devices, and the other half bridge includes third and fourth spin valve type electro-magnetic transformation devices, The first and third spin valve type electro-magnetic transformation devices are on the outside of the opening from the edge surface, and The second and fourth spin valve type magnetic transformation devices are on the inside of the opening form the edge surface.

17. The sensor according to claim 16, wherein the direction of the magnetic field to be applied to the first spin valve type electro-magnetic transformation device is opposite to the direction of the magnetic field to be applied to the second spin valve type electro-magnetic transformation device, the direction of the magnetic field to be applied to the third spin valve type electro-magnetic transformation device is opposite to the direction of the magnetic field to be applied to the fourth spin valve type electro-magnetic transformation device, and the direction of the magnetic field to be applied to the first spin valve type electro-magnetic transformation device is opposite to the direction of the magnetic field to be applied to the third spin valve type electro-magnetic transformation device.

18. The sensor according to claim 17, wherein the object is rotatable, and the magnetic sensor detects rotation of the object.

* * * * *